United States Patent
Hanelt et al.

(10) Patent No.: US 10,998,371 B1
(45) Date of Patent: May 4, 2021

(54) FILM-BASED IMAGE SENSOR WITH SUPPRESSED LIGHT REFLECTION AND FLARE ARTIFACT

(71) Applicant: APPLE INC., Cupertino, CA (US)

(72) Inventors: Erin Hanelt, Oakland, CA (US); Hong-Wei Lee, San Jose, CA (US)

(73) Assignee: APPLE INC., Cupertino, CA (US)

( * ) Notice: Subject to any disclaimer, the term of this patent is extended or adjusted under 35 U.S.C. 154(b) by 98 days.

(21) Appl. No.: 16/525,623

(22) Filed: Jul. 30, 2019

Related U.S. Application Data (60) Provisional application No. 62/719,714, filed on Aug. 20, 2018.

(51) Int. Cl.
*G01T 1/24* (2006.01)
*H01L 27/146* (2006.01)
(Continued)

(52) U.S. Cl.
CPC ............ *H01L 27/1467* (2013.01); *G01T 1/24* (2013.01); *H01L 27/1465* (2013.01); *H01L 27/14603* (2013.01); *H01L 27/14609* (2013.01); *H01L 27/14641* (2013.01); *H01L 27/14643* (2013.01); *H01L 27/14645* (2013.01); *H01L 27/14647* (2013.01); *H01L 27/14649* (2013.01); *H01L 27/14665* (2013.01); *H01L 27/14667* (2013.01); *H01L 27/14669* (2013.01);
(Continued)

(58) Field of Classification Search
CPC .............. G01T 1/24; H01L 27/14643; H01L 27/14645; H01L 27/14647; H01L 27/14649; H01L 27/1465; H01L 27/14665; H01L 27/14667; H01L 27/14669; H01L 27/1467

USPC ......................................... 250/370.08, 370.14
See application file for complete search history.

(56) References Cited

U.S. PATENT DOCUMENTS 7,132,726 B2    11/2006   Rueb et al.
7,923,801 B2 *   4/2011   Tian .................. H01L 27/14603
                                                             257/440
(Continued)

FOREIGN PATENT DOCUMENTS

WO      2008131313 A2    10/2008

OTHER PUBLICATIONS

International Application # PCT/US2017/057280 search report dated Jan. 23, 2018.
U.S. Appl. No. 16/341,901 office action dated Oct. 17, 2019.

*Primary Examiner* — Allen C. Ho
(74) *Attorney, Agent, or Firm* — Kligler & Associates Patent Attorneys Ltd (57) ABSTRACT

An imaging apparatus includes a semiconductor substrate and a stack of layers of one or more dielectric materials and one or more conducting materials formed on the semiconductor substrate so as to define an array of pixel circuits including respective pixel electrodes at an upper layer of the stack of layers of one or more dielectric materials and one or more conducting materials and logic circuitry in an area adjacent to the array of pixel circuits. A light-absorbing layer is formed on the upper layer of the stack of layers of one or more dielectric materials and one or more conducting materials so as to overlie the area containing the logic circuitry and configured to absorb at least 90% of light that is incident on the light-absorbing layer. A layer of a photosensitive medium overlies the pixel electrodes.

19 Claims, 7 Drawing Sheets

(51) Int. Cl.
*H01L 31/101* (2006.01)
*H01L 31/036* (2006.01)

(52) U.S. Cl.
CPC ...... *H01L 27/14692* (2013.01); *H01L 31/036* (2013.01); *H01L 31/1013* (2013.01)

(56) References Cited

U.S. PATENT DOCUMENTS

| | | | | |
|---|---|---|---|---|
| 8,638,381 | B2* | 1/2014 | Murata | H01L 27/14623 348/294 |
| 8,907,262 | B2* | 12/2014 | Yamaguchi | H01L 27/14607 250/208.1 |
| 9,196,781 | B2 | 11/2015 | Tian et al. | |
| 9,625,312 | B2* | 4/2017 | Hicks | H04N 5/3745 |
| 9,634,048 | B2* | 4/2017 | Kurokawa | H01L 27/14665 |
| 9,888,194 | B2* | 2/2018 | Duparre | B82Y 30/00 |
| 9,992,436 | B2* | 6/2018 | Mandelli | H01L 27/14601 |
| 10,250,826 | B2* | 4/2019 | Mandelli | H04N 5/363 |
| 10,446,594 | B2* | 10/2019 | Tashiro | H01L 27/14621 |
| 10,652,486 | B2* | 5/2020 | Mandelli | H01L 27/14665 |
| 10,735,672 | B2* | 8/2020 | Park | H01L 27/14623 |
| 2010/0214453 | A1 | 8/2010 | Murata | |
| 2012/0286137 | A1 | 11/2012 | Yamaguchi | |
| 2016/0037114 | A1 | 2/2016 | Mandelli et al. | |
| 2016/0284749 | A1 | 9/2016 | Kurokawa | |
| 2017/0162616 | A1 | 6/2017 | Tashiro et al. | |
| 2017/0208273 | A1 | 7/2017 | Mandelli et al. | |
| 2017/0264836 | A1 | 9/2017 | Mandelli et al. | |
| 2019/0253647 | A1 | 8/2019 | Park et al. | |

* cited by examiner

FILM-BASED IMAGE SENSOR WITH SUPPRESSED LIGHT REFLECTION AND FLARE ARTIFACT

CROSS-REFERENCE TO RELATED APPLICATION

This application claims the benefit of U.S. Provisional Patent Application 62/719,714, filed Aug. 20, 2018, which is incorporated herein by reference.

FIELD OF THE INVENTION

The present invention relates generally to optoelectronic devices, and particularly to image sensors.

BACKGROUND

Hybrid image sensors have a photosensitive layer overlaid on and connected to pixel circuitry on a silicon chip. For example, the photosensitive layer may comprise a photosensitive film, such as a film containing quantum dots (known as a quantum film).

A typical structure of a hybrid image sensor comprises a photosensitive layer, top and bottom conductive layers serving respectively as top and bottom electrodes to the photosensitive layer, and pixel circuitry. The photosensitive layer can be designed, for example, as a blanket photo-resistive layer with linear signal output as a function of an applied voltage, or with non-linear response to the applied voltage, similar to a photodiode response. The top electrode (or electrodes) on the photosensitive layer is typically common for a group of pixels or all pixels of the array and at least partially transparent to the incoming light, and is coupled to an electrode contact that provides the required bias voltage.

U.S. Pat. No. 8,558,286, whose disclosure is incorporated herein by reference, describes a photodetector along with corresponding materials, systems, and methods. The photodetector comprises an integrated circuit and at least two optically sensitive layers. A first optically sensitive layer is over at least a portion of the integrated circuit, and a second optically sensitive layer is over the first optically sensitive layer. Each optically sensitive layer is interposed between two electrodes. The two electrodes include a respective first electrode and a respective second electrode. The integrated circuit selectively applies a bias to the electrodes and reads signals from the optically sensitive layers. The signal is related to the number of photons received by the respective optically sensitive layer.

SUMMARY

Embodiments of the present invention that are described hereinbelow provide improved image sensors and methods for fabricating such sensors.

There is therefore provided, in accordance with an embodiment of the invention, imaging apparatus, including a semiconductor substrate and a stack of layers of dielectric and conducting materials formed on the semiconductor substrate so as to define an array of pixel circuits including respective pixel electrodes at an upper layer of the stack and logic circuitry in an area adjacent to the array of pixel circuits. A light-absorbing layer is formed on the upper layer of the stack so as to overlie the area containing the logic circuitry and configured to absorb at least 90% of light that is incident on the light-absorbing layer. A layer of a photosensitive medium overlies the pixel electrodes and has a lower surface in electrical contact with the pixel electrodes, and is configured to convert incident photons into charge carriers, which are collected by the pixel electrodes.

In some embodiments, the layer of the photosensitive medium overlies both the pixel electrodes and the light-absorbing layer.

In a disclosed embodiment, the light-absorbing layer includes a polymer film.

Additionally or alternatively, the light-absorbing layer includes a metallic material, which may be selected from a group of materials consisting of Ta, TaN, Ti, and TiN. In a disclosed embodiment, the light-absorbing layer and the pixel electrodes include the same metallic material, wherein the light-absorbing layer is thicker than the pixel electrodes.

Further additionally or alternatively, the light-absorbing layer is patterned.

In a disclosed embodiment, the photosensitive medium includes a quantum film.

There is also provided, in accordance with an embodiment of the invention, a method for fabricating an optical device. The method includes providing a semiconductor substrate, and forming on the semiconductor substrate a stack of layers of dielectric and conducting materials so as to define an array of pixel circuits including respective pixel electrodes at an upper layer of the stack and logic circuitry in an area adjacent to the array of pixel circuits. A light-absorbing layer, which is configured to absorb at least 90% of light that is incident on the light-absorbing layer, is overlaid on the area containing the logic circuitry. Subsequently, a layer of a photosensitive medium, which converts incident photons into charge carriers, is overlaid on the pixel electrodes, so that the pixel electrodes collect the charge carriers from the photosensitive medium.

In one embodiment, the light-absorbing layer and the pixel electrodes include the same metallic material, wherein the metallic material for both the light-absorbing layer and the pixel electrodes is deposited over the upper layer of the stack in a single process step, and the method includes etching the metallic material to define the pixel electrodes.

The present invention will be more fully understood from the following detailed description of the embodiments thereof, taken together with the drawings in which:

DETAILED DESCRIPTION OF EMBODIMENTS

Hybrid image sensors typically comprise a layer of a photosensitive medium, such as a quantum film (QF), which is sandwiched between an at least partially transparent, conductive top electrode (comprising, for example, ITO (indium-tin oxide) and bottom electrodes, also referred to as pixel electrodes. Each of the bottom electrodes defines a pixel of the image sensor and is connected to a corresponding pixel circuit. The top electrode is coupled to a bias contact, also referred to as a bias node, which provides the top electrode with a bias potential for the photosensitive layer.

The pixel circuits, as well as additional logic circuitry that supports the image sensor, are formed on a silicon substrate, with the logic circuitry located adjacent to the area utilized for image sensing. The reflectance from logic circuitry is inherently much higher than that of the photosensitive medium, which strongly absorbs incident light. This poses two problems:

1. While inspecting the image sensor during the fabrication process, the imbalance between the reflectances requires that the image sensing area and the logic circuitry area be inspected under separate illumination sources, with a consequent throughput penalty.
2. When using the image sensor, light reflected by the logic circuitry area will "bounce" within the sensor and cause optical flare, which lowers the performance of the sensor.

A possible solution for lowering the reflectance from the logic circuitry area is to cover this area with a light-absorbing polymer film, such as a color filter resist (used commonly for visible light) or so-called black resist (used commonly for near infra-red (NIR) radiation). This absorbing film is added after forming the layer of the photosensitive medium. (The terms "optical radiation", "radiation", and "light" as used in the present description and in the claims refer generally to any and all of visible, infrared, and ultraviolet radiation.)

This method is not well-suited, however, for an image sensor in which a QF is used as the photosensitive medium, for a number of reasons:

1. In order to achieve a high level of light absorption, the cross-linking of the resist-based absorbing film typically requires curing by either ultra-violet (UV) radiation or at an elevated temperature. Either option may cause a degradation of the QF, such as fusion (growth) of the quantum dots within the QF or detachment of the surface ligands of the QF. Both of these degradation mechanisms can have a severe impact on the performance and reliability of the QF.
2. There is a significant mismatch between the refractive indices of air and the resist-based absorbing film, leading to a strong reflection from the air/resist interface, which can itself give rise to problems of flare.

The embodiments of the present invention that are described herein address these problems by providing improved structures and fabrication methods for reducing reflections from the logic circuitry areas of QF image sensors. In the disclosed embodiments, a light-absorbing layer is deposited over the logic circuitry area prior to depositing the photosensitive layer over the pixel electrodes, thus avoiding the risk of damage to the photosensitive layer due to curing of the light-absorbing layer. Although this light-absorbing layer is shown in the figures as a single layer, it may alternatively comprise multiple sub-layers. In some embodiments, the photosensitive layer, such as a QF, is then deposited over the light-absorbing layer when it is deposited over the pixel electrodes, thus reducing still farther the reflections from the logic circuitry.

Figure 1:
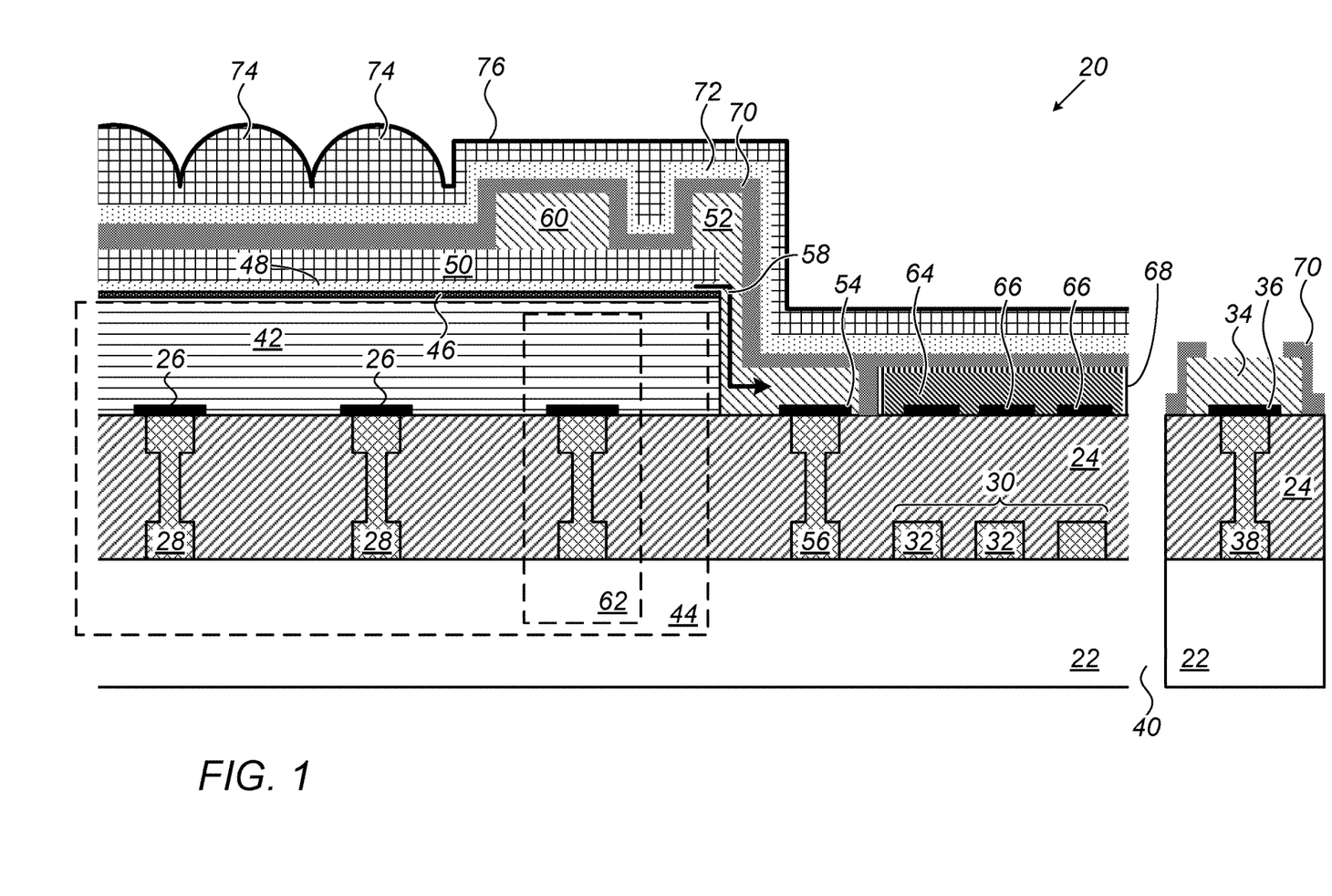
FIG. 1 is a schematic sectional view of a hybrid image sensor, in accordance with an embodiment of the invention.

FIG. 1 is a schematic sectional view of a hybrid image sensor 20, in accordance with an embodiment of the invention. Hybrid image sensor 20 comprises a semiconductor substrate 22, such as a silicon wafer, covered by dielectric layers 24, comprising silicon dioxide, for example. The thicknesses of the semiconductor substrate 22 and the various layers in FIG. 1 (as well as in subsequent figures) are not to scale; for example, dielectric layers 24 are typically only a few microns thick, whereas the thickness of the semiconductor substrate 22 is typically several hundred microns.

Dielectric layers 24 are part of a stack of layers of dielectric and conducting materials formed on semiconductor substrate 22 so as to define an array of pixel circuits comprising respective pixel electrodes 26 at the upper layer of the stack, as well as logic circuitry 30 in an area adjacent to the array of pixel circuits.

Pixel electrodes 26, located on top of dielectric layer 24, are connected to the pixel circuits on the semiconductor substrate 22 through metal-filled vias 28. Logic circuitry 30 comprises metal lines 32, which are highly reflective. Hybrid image sensor 20 is coupled to outside circuitry (not shown) through bond pad 34, of which one is shown as an example in FIG. 1. Bond pad 34 is connected to the logic circuitry 30 on the semiconductor substrate 22 by a bottom electrode 36 and a metal-filled via 38. This displacement of bond pad 34 from the image sensing part of the hybrid image sensor 20 is represented by a gap 40 in FIG. 1.

A layer of a photosensitive medium, such as a quantum film (QF) 42, overlies pixel electrodes 26 with its lower surface in electrical contact with the pixel electrodes 26. QF 42 converts incident photons into charge carriers, which are collected by pixel electrodes 26. QF 42, together with pixel electrodes 26 and their connections to the pixel circuits on the semiconductor substrate 22, define a photon detection array 44 of hybrid image sensor 20.

QF 42 is overlaid by a top encapsulation 46, a top contact 48, and a first passivation layer 50. Top contact 48 typically comprises indium-tin oxide (ITO) or other transparent of partially transparent and electrically conducting material, providing a current path to and from QF 42. Top encapsulation 46 and first passivation layer 50 are commonly used in image sensors based on quantum films, and serve to separate and stabilize the layers of the sensor. Top contact 48 is connected by a conductor 52 (comprising, for example, aluminum) to a QF bias node 54, and further through a QF bias via 56 to bias circuitry on the semiconductor substrate 22. Conductor 52 provides a path for the flow of electrical current from top contact 48 to QF bias node 56, as shown by an arrow 58. An optical shield 60, made from the same material as conductor 52, for example, prevents light from reaching a dark pixel 62, which is used for calibration purposes.

Prior to the overlaying of QF 42 on pixel electrodes 26, a light-absorbing layer 64 is formed on the upper layer of the stack of the metal and dielectric layers, at the level of pixel electrodes 26, so as to overlie the area of logic circuitry 30. The purpose of light-absorbing layer 64 is to attenuate the reflection of light impinging on logic circuitry 30, by absorbing at least 90% of light that is incident on this area.

Light-absorbing layer 64 may comprise any suitable material that absorbs optical radiation in the spectral range of interest, for example (without limitation) TiN, Ti, Ta, TaN, W, Pt, Cr, Ni, or colored resist (optionally black resist, as described above). Taking into account the wavelength of light and the extinction coefficient of the material, the thickness of light-absorbing layer 64 is chosen so that it absorbs at least 90% of the incident light. Pads 66, similar to pixel electrodes 26, may be optionally formed between light-absorbing layer 64 and oxide layer 26 in order to collect any charge carriers that may accumulate in this area. Because light-absorbing layer 64 is coated and patterned during the fabrication process before depositing QF 42, materials and fabrication processes can be used in forming the light-absorbing layer that would have a deleterious effect on QF 42 if it were already in place. Light-absorbing layer 64 is optionally coated with a capping layer 68, comprising an oxide or nitride, in order to avoid interaction with subsequent layers.

Following the deposition of QF 42 and light-absorbing layer 64, additional overlying layers may be deposited, as are known in the art. In the pictured example, hybrid image sensor 20 is coated by a second passivation layer 70. The areas over photon detection array 44 and logic circuitry 30 can be further coated by a multi-layer anti-reflective coating (ARC) 72. Microlenses 74 are formed in a dielectric material over the pixels of photon detection array 44 to enhance the collection of light into the pixels. A single-layer ARC 76 is coated over microlenses 74 (and the unpatterned dielectric material) as a further antireflective coating. Windows are opened at bonding pads 34 in order to enable connecting the bonding pads to outside circuitry. The fabrication process is shown in further detail in FIG. 6.

In some instances, the reflectance from logic circuitry area 30 of hybrid imaging sensor 20 may be as high as 90% in the absence of an overlying light-absorbing layer. This reflectance can be reduced significantly by light-absorbing layer 64, with decreasing reflectance as the thickness of the light-absorbing layer increases.

Figure 2:
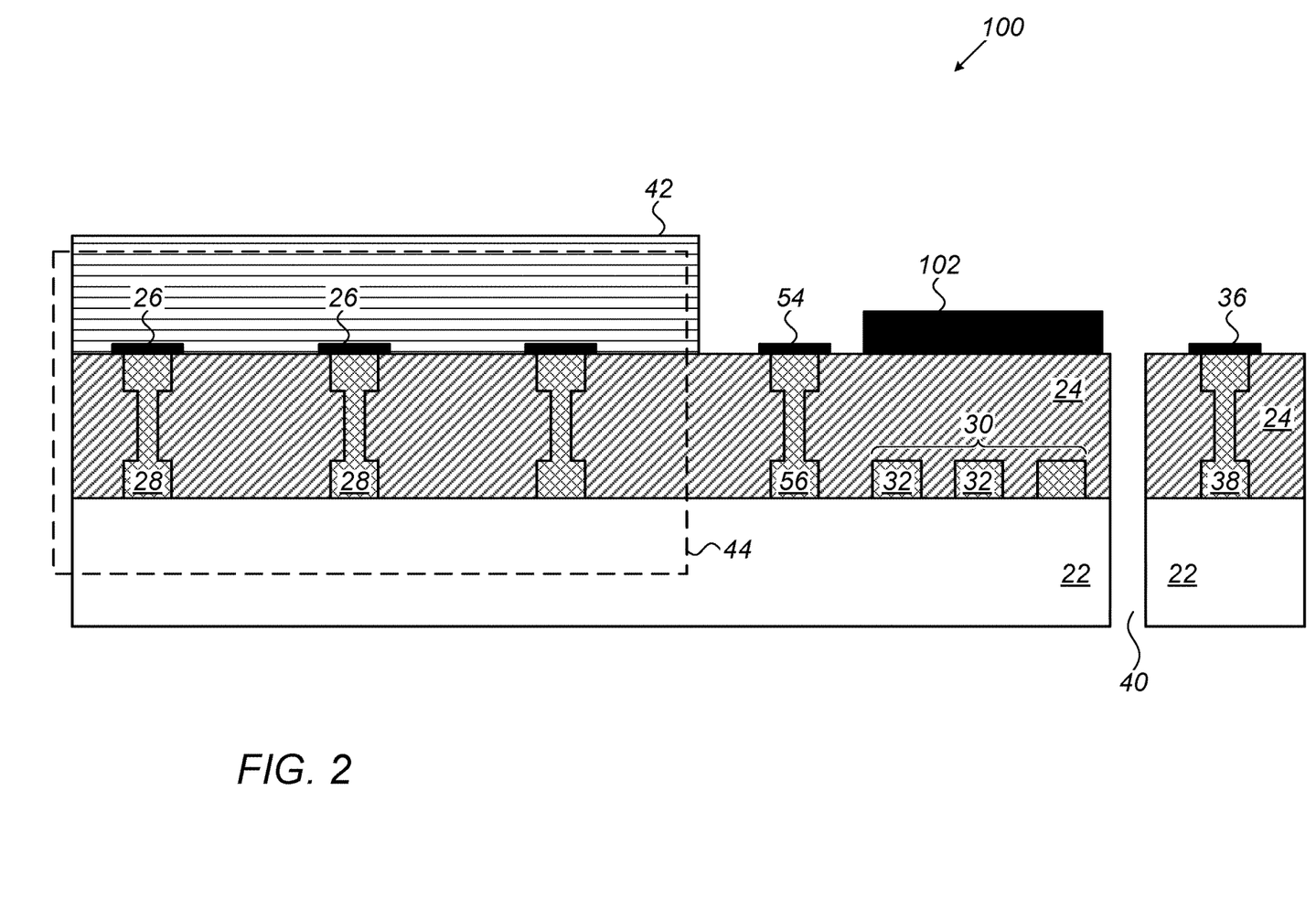
FIGS. 2-5 are schematic partial sectional views of hybrid image sensors, in accordance with embodiments of the invention.

FIG. 2 is a schematic sectional view of a hybrid image sensor 100, in accordance with another embodiment of the invention. Hybrid image sensor 100 is shown at a stage in fabrication at which a light-absorbing layer 102 and QF 42 have been formed over the stack of layers of dielectric and conducting materials making up the pixel circuits and logic circuitry 30. Aside from the substitution of light-absorbing layer 102 in FIG. 2 for layer 64 in FIG. 1, sensor 100 is similar in design to sensor 20. For the sake of simplicity, however, only the layers up to and including light-absorbing layer 102 and QF 42 are shown in FIG. 2, and the additional components shown in FIG. 1 will be added, mutatis mutandis, to the embodiment of FIG. 2 in later stages of fabrication. Components similar or identical to those of hybrid image sensor 20 are numbered with the same labels.

The material of light-absorbing layer 102 in the disclosed embodiment is the same as the material of electrodes 26, 36, and 54, for example TiN, Ti, Ta, or TaN. The process steps of the disclosed embodiment, as well as those of FIGS. 3 and 5, will be described in further detail with reference to FIG. 7, with the main features of the part of the process for forming the electrodes and light-absorbing layer 102 being the following:

1. The electrode material is deposited as a layer that is sufficiently thick to absorb a large percentage of the incident light (for example at least 90% of the incident light using a layer that is at least about 50 nm thick in the case of a Ta, Ti or TiN, for example).
2. The electrode material is then thinned down in the areas of electrodes 26, 36, and 54 by etching, while light-absorbing layer 102 is protected from the etch by a patterned photoresist formed over the area of layer 102. The light that has been transmitted through QF 42 and the thinned electrodes will reflect back from underlying layers into the QF, thus increasing the quantum efficiency of the QF.
3. The lateral extents of individual electrodes and light-absorbing layer 102 are defined by selective etch, while they are protected by a second patterned photoresist.

As compared to hybrid image sensor 20 (FIG. 1), hybrid image sensor 100 has the advantage of utilizing the same materials and process tools for light-absorbing layer 102 as for the electrodes. A disadvantage is the need to use an additional photo/etch step for generating the two different thicknesses.

The reflectance from logic circuitry area 30 of hybrid image sensor 100 varies similarly to hybrid light sensor 20, depending on the thickness of light-absorbing layer 102.

Figure 3:
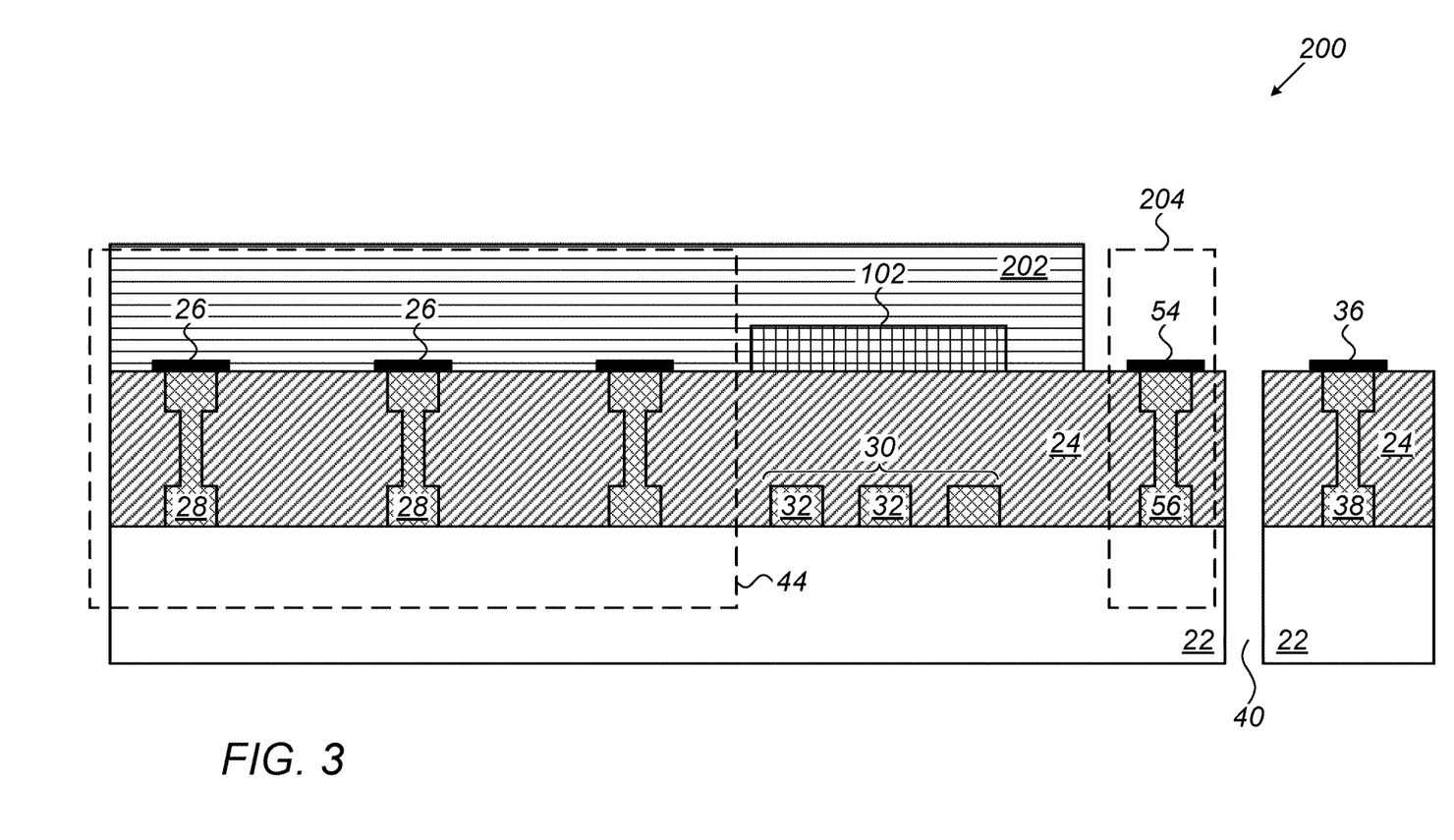

FIG. 3 is a schematic sectional view of a hybrid image sensor 200, in accordance with yet another embodiment of the invention. Hybrid image sensor 200 is similar to hybrid image sensor 100, with the main difference being that a QF 202 covers both pixel area 44 and light-absorbing layer 102. Furthermore, QF bias node 54 and QF bias via 56 have been moved to a location 204 outside of QF 202, as required for connecting the QF to the QF bias node Other components of hybrid image sensor 200 are similar or identical to their counterparts in hybrid image sensor 100.

An advantage of extending QF 202 over light-absorbing layer 102 is that the QF adds further absorption of the incident light, thus further reducing reflections from the area of logic circuitry 30. The charges generated by the absorption of light in the part of QF 202 above light-absorbing layer 102 generally recombine, rather than draining into pixel area 44.

Due to the added absorption within QF 202, the reflectance of the area of logic circuitry 30 can be reduced even further.

Figure 4:
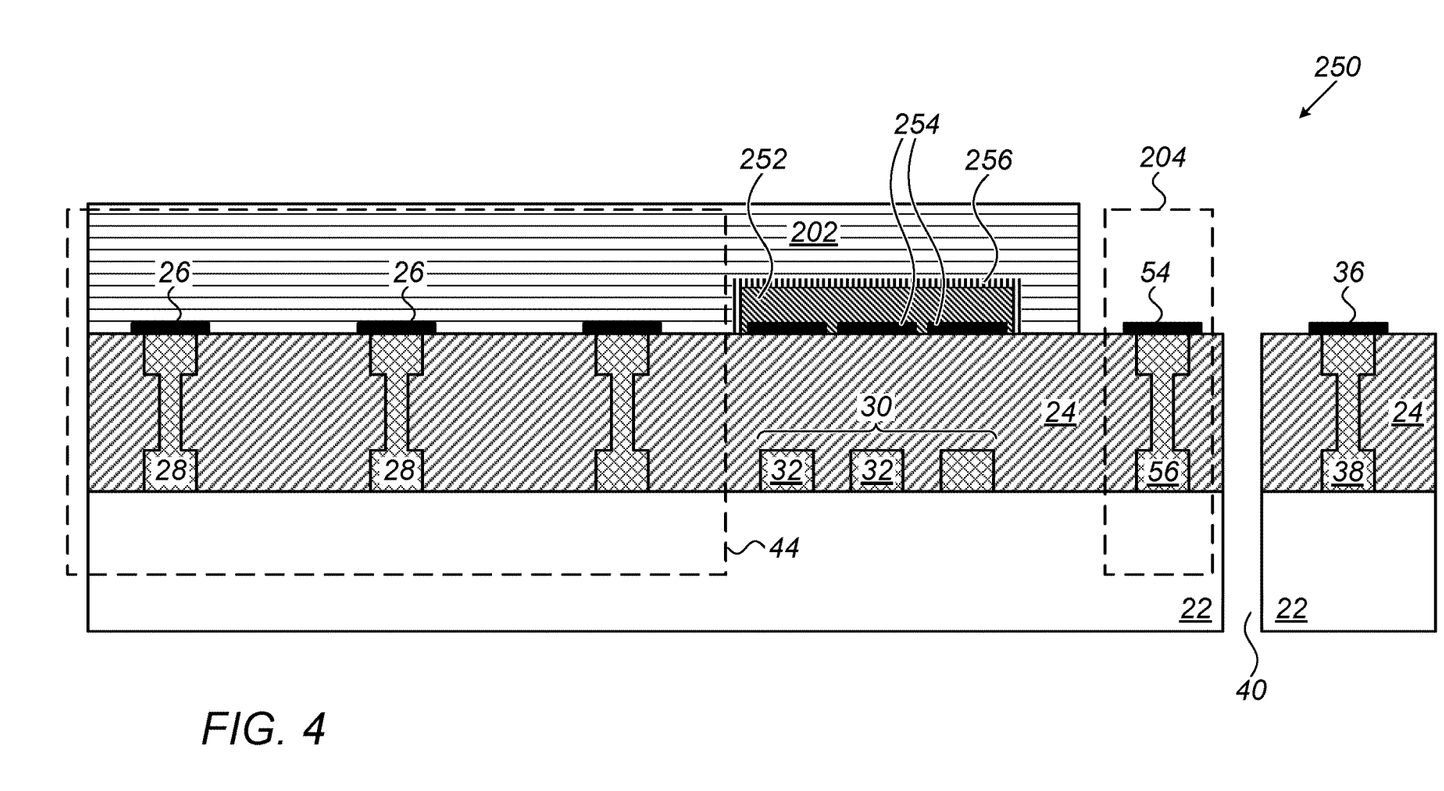

FIG. 4 is a schematic sectional view of a hybrid image sensor 250, in accordance with still another embodiment of the invention. Hybrid image sensor 250 is similar to hybrid image sensor 200, except that light-absorbing layer 102 has been replaced by a colored resist layer 252, using a colored or black resist of the types described above with reference to hybrid light sensor 20 (FIG. 1) in terms of both material and thickness. Further, similarly to hybrid light sensor 20, pads 254 have been formed between colored resist layer 252 and oxide layer 24, and the colored resist layer has been coated with a capping layer 256 in order to avoid interaction of the colored resist layer with QF 202. As the process is similar to that used for hybrid light sensor 20, it is further described with reference to the flowchart of FIG. 6.

Figure 5:
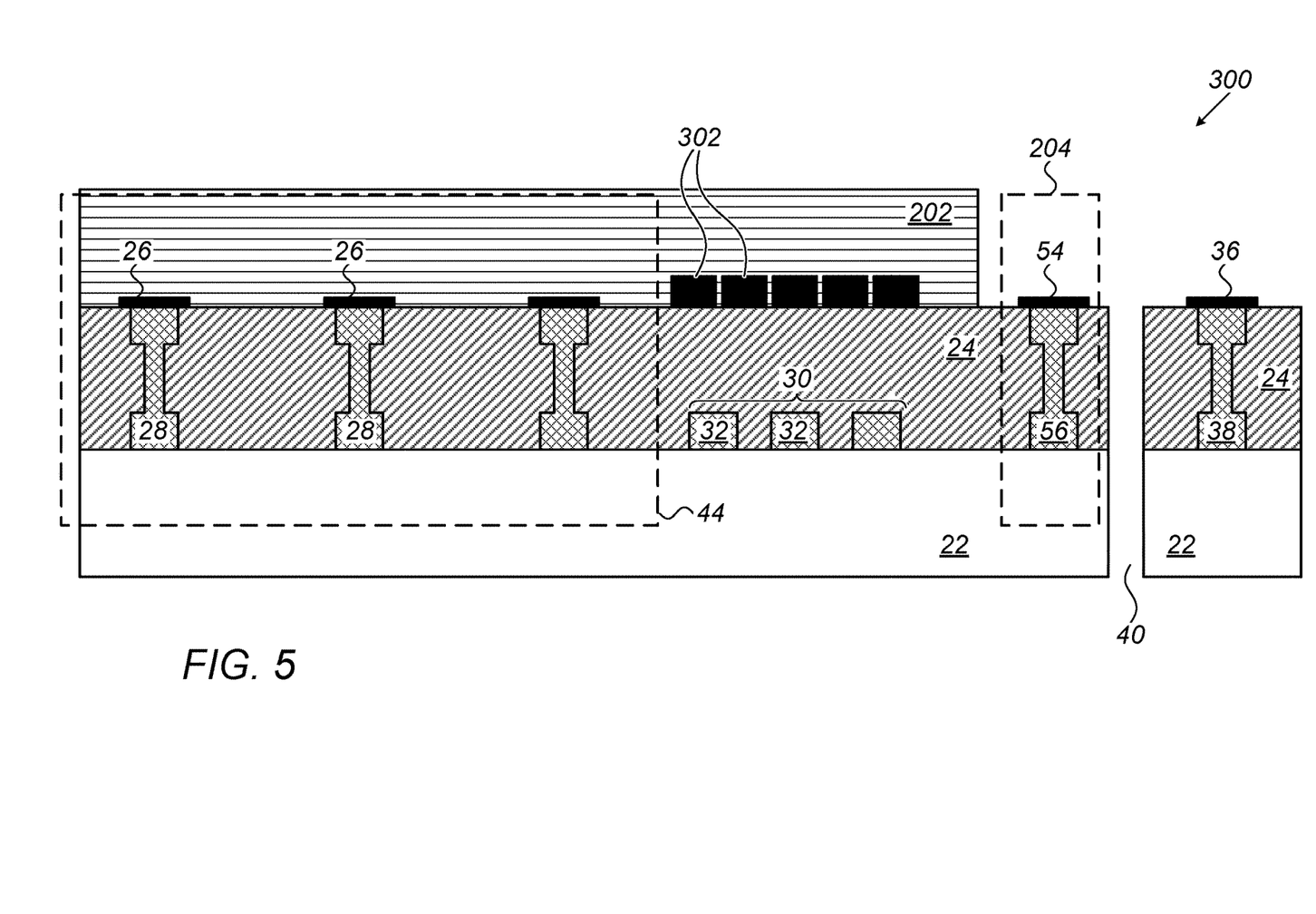

FIG. 5 is a schematic sectional view of a hybrid image sensor 300, in accordance with a further embodiment of the invention. Hybrid image sensor 300 is similar to hybrid image sensor 200, with the difference that light-absorbing layer 102 of FIG. 3 has been replaced by a patterned light-absorbing layer 302. The patterning enhances the adhesion of QF 202 in the area of logic circuitry 30. The choice of material and its thickness for patterned light-absorbing layer 302 is similar to that of light-absorbing layer 102. As the fabrication process is similar to that used for hybrid image sensor 200, it is described in FIG. 7.

Figure 6:
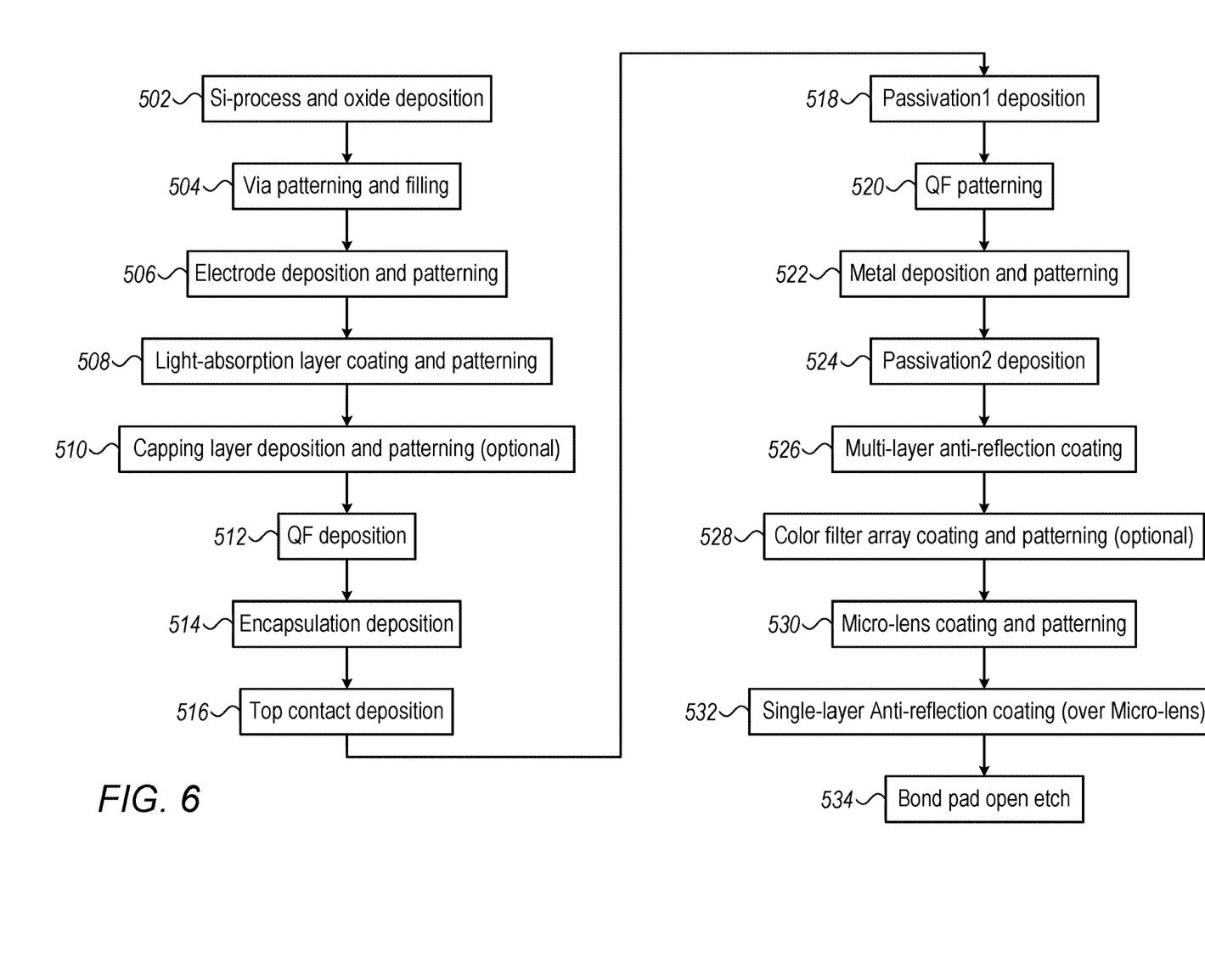
FIGS. 6-7 are flowcharts that schematically illustrate fabrication processes for hybrid image sensors, in accordance with embodiments of the invention.

FIG. 6 is a flowchart that schematically illustrates the fabrication process of hybrid image sensors 20 and 250 (FIGS. 1 and 4, respectively), in accordance with an embodiment of the invention.

With further reference to FIGS. 1 and 4, in an Si/oxide step 502, silicon substrate 22 is processed, generating the circuitry on the substrate. As a result of this step, oxide layer 24 is deposited over the substrate. In a via step 504, vias 28, 38, and 56 are patterned and opened in oxide layer 24, and filled with a conducting material (for example aluminum or copper). In an electrode step 506, electrodes 26, 36, and 54 are deposited and patterned. The deposition and patterning may optionally include pads 66. The material for electrodes 26, 36, and 54 can be, for example, one of the following: Ti, TiN, Ta, or TaN, or any other suitable material that is known in the art.

In a light-absorbing layer step 508, a layer of light-absorbing material 64 (for example, Ti, TiN, Ta, TaN, or colored resist) is deposited and patterned over logic circuitry area 30. As the deposition and patterning of light-absorbing layer 64 takes place before depositing QF 42, the deposition and patterning temperatures of the light-absorbing layer are not limited by the thermal constraints imposed by the QF, which typically require that the temperature of the QF is not raised above 180° for more than 10 min. In an optional capping step 510, light-absorbing layer 64 is coated with capping layer 68, typically comprising an oxide or nitride.

In a QF step 512, QF 42 is deposited over the area off photon detection array 44 and possibly over the area of logic circuitry 30, as well. In an encapsulation step 514, QF 42 is coated with a top encapsulation 46. In a top contact deposition step 516, top contact 48, typically comprising indium-tin oxide (ITO) or other transparent of partially transparent and electrically conducting material, is deposited over top encapsulation 46. In a first passivation step 518, a first passivation layer 50 is deposited. In a QF patterning step 520, QF 42 is patterned either over pixel area 44 (hybrid image sensor 20) or over pixel area 44 and logic circuitry area 30 (hybrid image sensor 250), forming in each case the light-sensitive layer for the hybrid image sensor.

In a metal deposition step 522, a metal layer, for example aluminum, is deposited and patterned to form conductor 52 and optical shield 60. In a second passivation step 524, second passivation layer 70 is deposited. In a multi-layer ARC step 526, multi-layer anti-reflective coating (ARC) 72 is deposited. In an optional color filter step 528, color filters (not shown) are deposited on pixel area 44 for enabling hybrid image sensor 20 to function as a color sensor.

In a micro-lens step 530, a dielectric material is deposited and formed into micro-lenses 74 over pixel area 44. In a single-layer ARC step 532, single-layer ARC 76 is deposited over micro-lenses 74 and the unpatterned dielectric material. In a bond pad step 534, windows are opened to uncover bond pads 34 in order to provide access for external connections to the bond pads.

Figure 7:
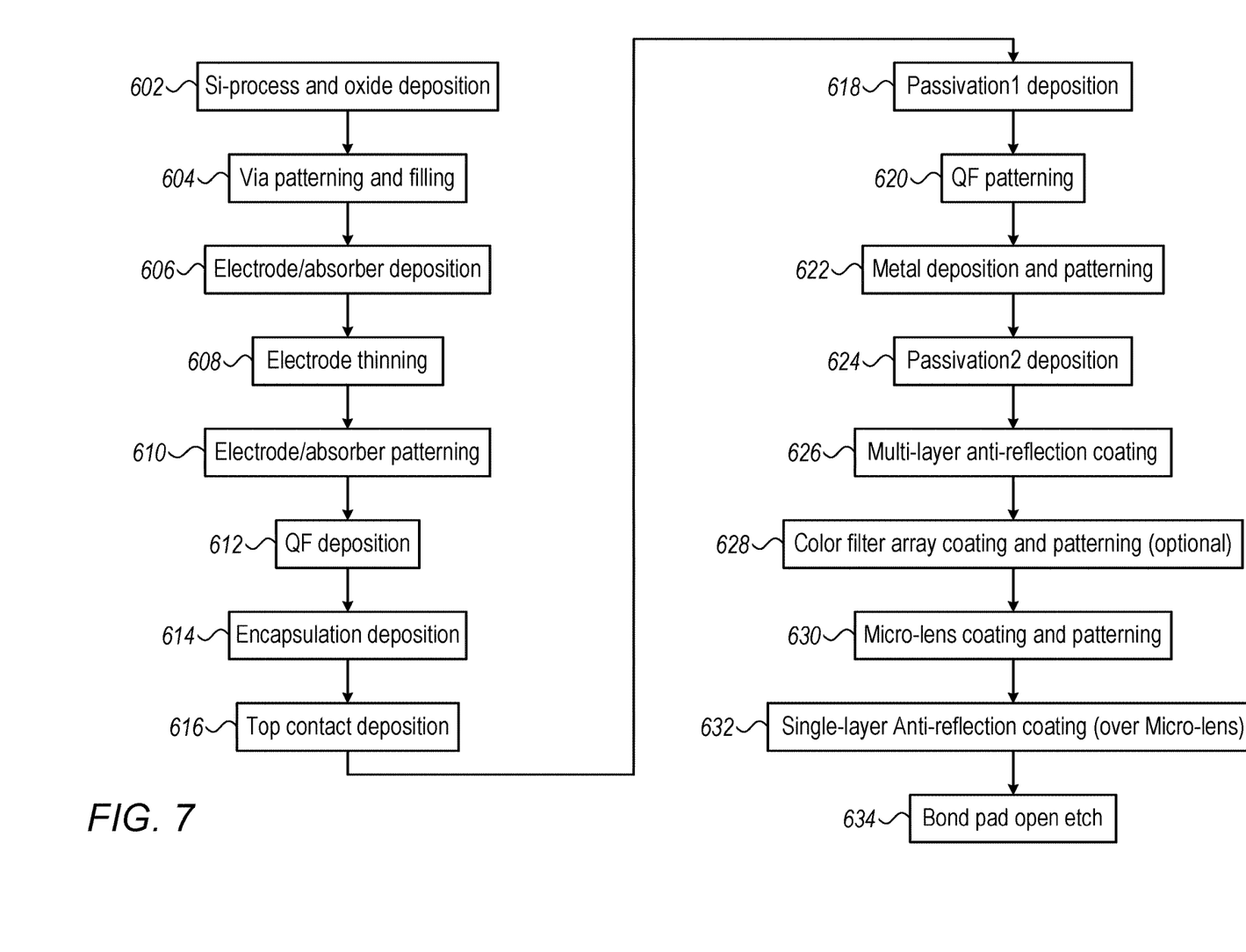

FIG. 7 is a flowchart that schematically illustrates the fabrication processes of hybrid image sensors 100, 200, and 300 (FIGS. 2, 3, and 5, respectively), in accordance with embodiments of the invention. As the fabrication processes for these three embodiments are very similar, they are described with the single flowchart of FIG. 7, with specific differences pointed out.

With further reference to FIGS. 2, 3, and 5, in an Si/oxide step 602, silicon substrate 22 is processed, generating the circuitry on the substrate. As a result of this step, oxide layer 24 is deposited over the substrate. In a via step 604, vias 28, 38, and 56 are patterned and opened in oxide layer 24, and filled with a conducting material (for example aluminum or copper).

In an electrode/absorber deposition step 606, a thick layer of conductive material, for example Ti, TiN, Ta, or TaN, is deposited over oxide layer 24. In an electrode thinning step 608, the conductive material (which is to form electrodes 26, 36, and 54) is thinned, while light-absorbing layer 102 (FIGS. 2-3) or a preform for patterned light-absorbing layer 302 (FIG. 5) are protected by a first photoresist. In an electrode/absorber patterning step 610, electrodes 26, 36, and 54, as well as light-absorbing layer 102 (FIGS. 2-3) or patterned light-absorbing layer 302 (FIG. 5), are patterned.

In a QF step 612, QF 42 is deposited over the area off photon detection array 44 and possibly over the area of logic circuitry 30, as well. In an encapsulation step 614, QF 42 is overlaid by a top encapsulation 46. In a top contact deposition step 616, top contact 48, typically comprising indium-tin oxide (ITO) or other transparent of partially transparent and electrically conducting material, is deposited over top encapsulation 46. In a first passivation step 618, a first passivation layer 50 is deposited.

In a QF patterning step 620, QF 42 is patterned as follows:
In hybrid image sensor 100 (FIG. 2), QF 42 is patterned to cover only pixel area 44;
In hybrid image sensors 200 and 300 (FIGS. 3 and 5, respectively), QF 42 is patterned to cover both pixel area 44 and logic circuitry area 30.

From here onwards, the processes for hybrid image sensors 100, 200, and 300 follow the process for hybrid image sensors 20 and 250, shown in FIG. 6. For the sake of completeness, the remaining process is described below with reference to FIG. 1.

In a metal deposition step 622, a metal layer, for example aluminum, is deposited and patterned to form conductor 52 and optical shield 60. In a second passivation step 624, second passivation layer 70 is deposited. In a multi-layer ARC step 626, multi-layer anti-reflective coating (ARC) 72 is deposited. In an optional color filter step 628, color filters (not shown) are deposited on pixel area 44 for enabling hybrid image sensors 100, 200, or 300 to function as a color sensor.

In a micro-lens step 630, a dielectric material is deposited and formed into micro-lenses 74 over pixel area 44. In a single-layer ARC step 632, single-layer ARC 76 is deposited over micro-lenses 74 and the unpatterned dielectric material. In a bond pad step 634, the layers covering bond pads 34 are etched away to provide access for external connections to the bond pads.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An imaging apparatus, comprising:
a semiconductor substrate;
a stack of layers of one or more dielectric materials and one or more conducting materials formed on the semiconductor substrate so as to define an array of pixel circuits comprising pixel electrodes at an upper layer of the stack of layers of one or more dielectric materials and one or more conducting materials and logic circuitry in an area adjacent to the array of pixel circuits;
a light-absorbing layer formed on the upper layer of the stack of layers of one or more dielectric materials and one or more conducting materials so as to overlie the area containing the logic circuitry and configured to absorb at least 90% of light that is incident on the light-absorbing layer; and
a layer of a photosensitive medium, which overlies the pixel electrodes and has a lower surface in an electrical contact with the pixel electrodes, and which is configured to convert incident photons into charge carriers, which are collected by the pixel electrodes.

2. The imaging apparatus according to claim 1, wherein the layer of the photosensitive medium overlies both the pixel electrodes and the light-absorbing layer.

3. The imaging apparatus according to claim 1, wherein the light-absorbing layer comprises a polymer film.

4. The imaging apparatus according to claim 1, wherein the light-absorbing layer comprises a metallic material.

5. The imaging apparatus according to claim 4, wherein the metallic material is selected from a group of materials consisting of Ta, TaN, Ti, and TiN.

6. The imaging apparatus according to claim 4, wherein the light-absorbing layer and the pixel electrodes comprise a same metallic material.

7. The imaging apparatus according to claim 6, wherein the light-absorbing layer is thicker than the pixel electrodes.

8. The imaging apparatus according to claim 4, wherein the light-absorbing layer is patterned.

9. The imaging apparatus according to claim 1, wherein the layer of the photosensitive medium comprises a quantum film.

10. A method for fabricating an optical device, the method comprising:
providing a semiconductor substrate;
forming on the semiconductor substrate a stack of layers of one or more dielectric materials and one or more conducting materials so as to define an array of pixel circuits comprising pixel electrodes at an upper layer of the stack of layers of one or more dielectric materials and one or more conducting materials and logic circuitry in an area adjacent to the array of pixel circuits;
overlaying a light-absorbing layer, which is configured to absorb at least 90% of light that is incident on the light-absorbing layer, on the area containing the logic circuitry; and
subsequently overlaying a layer of a photosensitive medium, which converts incident photons into charge carriers, on the pixel electrodes, so that the pixel electrodes collect the charge carriers from the layer of the photosensitive medium.

11. The method according to claim 10, wherein subsequently overlaying the layer of the photosensitive medium comprises subsequently overlaying the layer of the photosensitive medium over both the pixel electrodes and the light-absorbing layer.

12. The method according to claim 10, wherein the light-absorbing layer comprises a polymer film.

13. The method according to claim 10, wherein the light-absorbing layer comprises a metallic material.

14. The method according to claim 13, wherein the metallic material is selected from a group of materials consisting of Ta, TaN, Ti, and TiN.

15. The method according to claim 13, wherein the light-absorbing layer and the pixel electrodes comprise a same metallic material.

16. The method according to claim 15, wherein the light-absorbing layer is overlaid to a thickness greater than a thickness of the pixel electrodes.

17. The method according to claim 15, wherein the metallic material for both the light-absorbing layer and the pixel electrodes is deposited over the upper layer of the stack of layers of one or more dielectric materials and one or more conducting materials in a single process step, and the method comprises etching the metallic material to define the pixel electrodes.

18. The method according to claim 10, further comprising patterning the light-absorbing layer.

19. The method according to claim 10, wherein the layer of the photosensitive medium comprises a quantum film.

* * * * *